United States Patent
Suzuki et al.

(10) Patent No.: US 7,015,483 B2
(45) Date of Patent: Mar. 21, 2006

(54) FOCUSED ION BEAM SYSTEM

(75) Inventors: Wataru Suzuki, Hitachinaka (JP); Eiichi Hazaki, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/863,480

(22) Filed: Jun. 9, 2004

(65) Prior Publication Data

US 2004/0251413 A1 Dec. 16, 2004

(30) Foreign Application Priority Data

Jun. 11, 2003 (JP) ............................ 2003-166715

(51) Int. Cl.
*H01J 37/20* (2006.01)

(52) U.S. Cl. .................. 250/442.21; 250/442.11; 250/440.11; 250/309

(58) Field of Classification Search .............. 250/311, 250/310, 442.11, 307, 492.21, 492.2, 306, 250/309
See application file for complete search history.

(56) References Cited

U.S. PATENT DOCUMENTS

| | | | |
|---|---|---|---|
| 5,270,552 A | | 12/1993 | Ohnishi et al. |
| 5,326,971 A | * | 7/1994 | Theodore et al. ............ 250/311 |
| 5,922,179 A | * | 7/1999 | Mitro et al. ............ 204/298.04 |
| 6,002,136 A | * | 12/1999 | Naeem ................... 250/442.11 |
| 6,538,254 B1 | * | 3/2003 | Tomimatsu et al. .... 250/442.11 |
| 6,677,595 B1 | * | 1/2004 | Aiba ...................... 250/442.11 |
| 2002/0079463 A1 | * | 6/2002 | Shichi et al. ............. 250/492.1 |
| 2005/0054029 A1 | * | 3/2005 | Tomimatsu et al. ......... 435/40.5 |

FOREIGN PATENT DOCUMENTS

| | | |
|---|---|---|
| JP | 5-52721 | 3/1993 |
| JP | 6-103947 | 4/1994 |
| JP | P2000-155081 A | 6/2000 |
| JP | P2002-319364 A | 10/2002 |

OTHER PUBLICATIONS

E. C. G. Kirk, et al., "Cross-Sectional Transmission Electron Microscopy of Precisely Selected Regions From Semiconductor Devices", Microscopy of Semiconducting Materials, Institute of Physics Series No. 100, pp. 501-506, Apr. 1989.
J. R. A. Cleaver, et al., "Scanning Ion Beam Techniques for the Examination of Microelectronic Devices", J. Vac. Sci. Technol. B6(3), May/Jun. 1988, pp. 1026-1029.

* cited by examiner

*Primary Examiner*—Nikita Wells
*Assistant Examiner*—Johnnie L Smith, II
(74) *Attorney, Agent, or Firm*—McDermott Will & Emery LLP

(57) ABSTRACT

A focused ion beam system comprises a specimen chamber, a FIB column, a SEM stage, a side entry stage, a TEM specimen holder, a micro-sampling manipulator, and a SEM holder exchanger chamber. The SEM stage comprises an x-table, a y-table, a z-table, a rotation table, and a tilt table for moving a specimen. The side entry stage comprises an x-micromotion driver and a yzt-micromotion driver which are disposed in the specimen chamber to oppose each other. The x-micromotion driver is disposed in a hollow area defined in a tilt shaft provided for the tilt table.

10 Claims, 9 Drawing Sheets

FOCUSED ION BEAM SYSTEM

BACKGROUND OF THE INVENTION

The present invention relates to a focused ion beam system which is suitable for use in fabricating a specimen for a transmission electron microscope (TEM), a scanning electron microscope (SEM), and the like, and more particularly, to a focussed ion beam system which is suitable for creating a specimen for TEM.

The TEM and SEM have been used for analyzing semiconductor devices, and a focused ion beam system has been utilized for processing materials with a focussed ion beam to fabricate specimen therefor. The focused ion beam system is configured to share a specimen holder with TEM or SEM. Specifically, the focused ion beam system can removably mount a TEM specimen holder or a SEM specimen holder. Therefore, after a specimen has been fabricated by the focussed ion beam system, the specimen holder can be removed from the focussed ion beam system, with the resulting specimen held therein, and mounted to the TEM or SEM for observing the specimen.

E. C. G. Kirk et al, for example, has described a method of creating a specimen for TEM using a focussed ion beam system and a side entry stage in Microscopy of Semiconducting Materials 1989, Institute of Physics Series No. 100, pp. 501–506.

For the SEM, specimen can be created by simple works. A specimen piece for observation by SEM has dimensions on the order of several centimeters for IC chips, wafers, and the like. Therefore, the SEM excels in the ease of handling a specimen because the specimen can be readily carried on a specimen holder (see JP-A-2002-319364). The SEM, however, has the disadvantage of a low resolution.

The TEM, though having a high resolution, involves difficult works for creating specimen. A specimen piece for observation by the TEM must be finished on the order of several millimeters. Thus, the operator experiences difficulties in mounting a cut-out miniature specimen piece in a specimen holder. Since the small specimen piece itself causes difficulties in handling, the operator is highly likely to drop, lose, or damage the specimen piece. In addition, difficulties are also encountered in cutting out a specimen piece including a site under observation, leading to a long time taken for fabricating such a specimen piece.

SUMMARY OF THE INVENTION

It is an object of the present invention to provide a focused ion beam system which is capable of creating a specimen for observation by a TEM, and facilitating works for mounting the specimen in a specimen holder associated with the TEM.

According to the present invention, a focused ion beam system includes a specimen chamber, an FIB column disposed in the specimen chamber, a SEM stage disposed in the specimen chamber and having a SEM specimen holder, a side entry stage and a TEM specimen holder disposed along an x-axis direction of the specimen chamber, and a micro-sampling manipulator and a SEM holder exchanger chamber disposed along a y-axis direction of the specimen chamber.

A miniature specimen piece can be cut out from a specimen held by the SEM specimen holder, and transported to the TEM specimen holder.

Other objects, features and advantages of the invention will become apparent from the following description of the embodiments of the invention taken in conjunction with the accompanying drawings.

DESCRIPTION OF THE INVENTION

Figure 1:
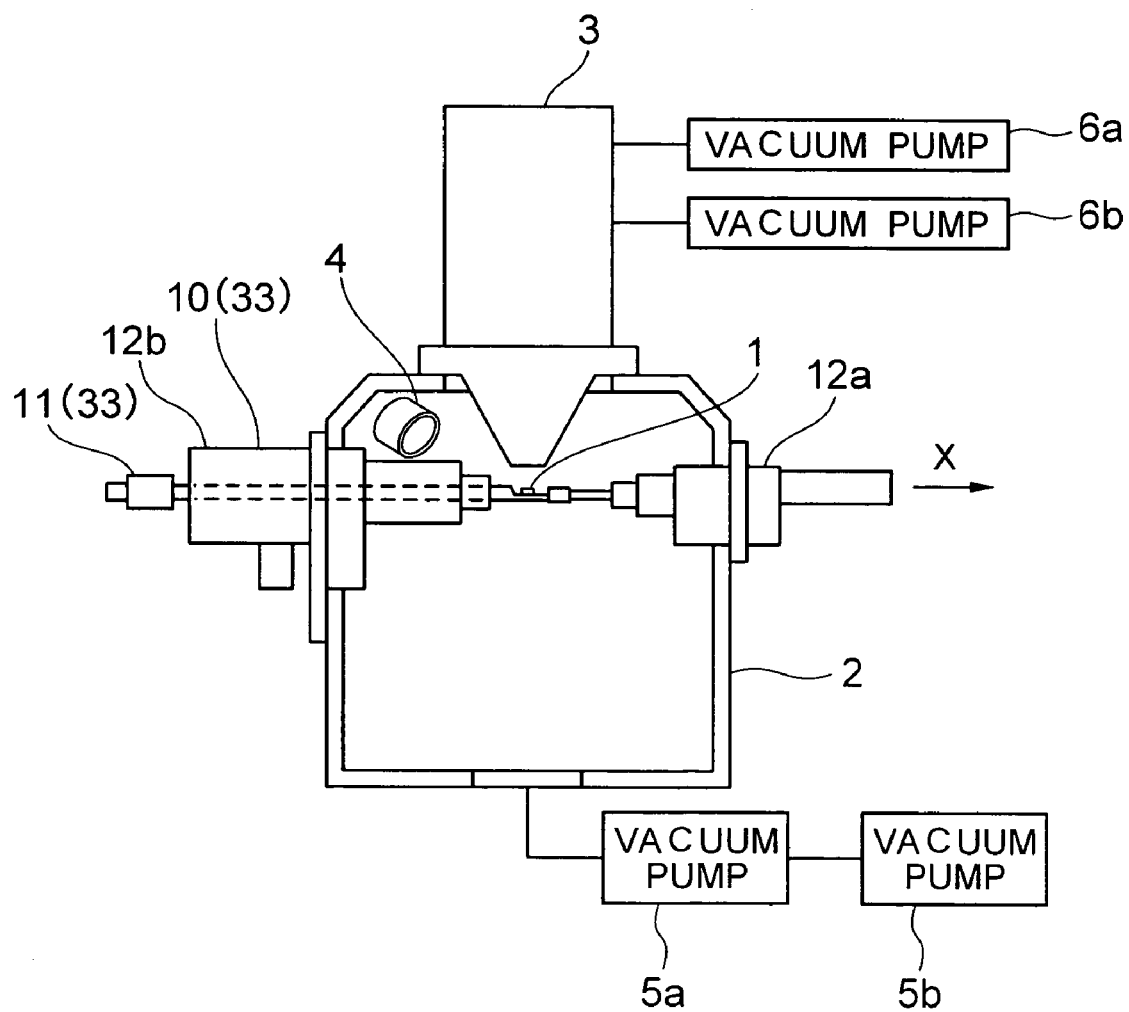
FIG. 1 is a longitudinal sectional view illustrating a conventional focused ion beam system which is equipped with a side entry stage.

Referring now to FIG. 1, description will be made on the configuration of a focused ion beam system which is mounted with a TEM specimen holder. The illustrated focused ion beam system comprises a specimen chamber 2; an FIB column 3 disposed above the specimen chamber 2; a side entry stage 10 disposed along an x-axis direction; a secondary electron detector 4 for detecting secondary electrons; and vacuum pumps 5a, 5b and 6a, 6b for evacuating the specimen chamber 2 and FIB column 3, respectively.

The side entry stage 10 includes a specimen holder 11 for holding a specimen 1 (hereinafter called the "TEM specimen holder"); an x-micromotion driver 12a for moving the specimen 1 in the x-direction; and a yzt-micromotion driver 12b having a tilt mechanism for moving the specimen 1 in the y- and z-directions (optical axis) and rotating the specimen 1 about a tilt axis. The x-micromotion driver 12a and yzt-micromotion driver 12b are mounted on opposing side surfaces of the specimen chamber 2, respectively, such that the yzt-micromotion driver 12b opposes the x-micromotion driver 12a. The specimen 1 is carried at a leading end of the TEM specimen holder 11.

The TEM specimen holder 11 is introduced into or extracted from the yzt-micromotion driver 12b. The yzt-micromotion driver 12b is provided with a vacuuming mechanism which enables the TEM specimen holder 11 to be introduced into or extracted from the yzt-micromotion driver 12b without opening the specimen chamber 2, which is held in vacuum 2, to the atmosphere. The TEM specimen holder 11 inserted into the yzt-micromotion driver 12b is drawn into the specimen chamber 2 by the attractive force of vacuum, and is kept in press contact with the x-micromotion driver 12a at all times to follow movements of the x-micromotion driver 12a.

An ion beam from the FIB column 3 is irradiated to the specimen 1 from which secondary electrons are generated. The secondary electrons can be detected by the secondary electron detector 4 to produce a SIM (Scanning Ion Microscope) image for observing the shape on the surface of the specimen 1. The energy of the ion beam should be increased when the surface of the specimen 1 is processed.

After creating a specimen for observation by the TEM, the TEM specimen holder 11 which carries the created specimen is withdrawn from the yzt-micromotion driver 12b, and inserted into the yzt-micromotion driver of the TEM for observation.

Figure 2:
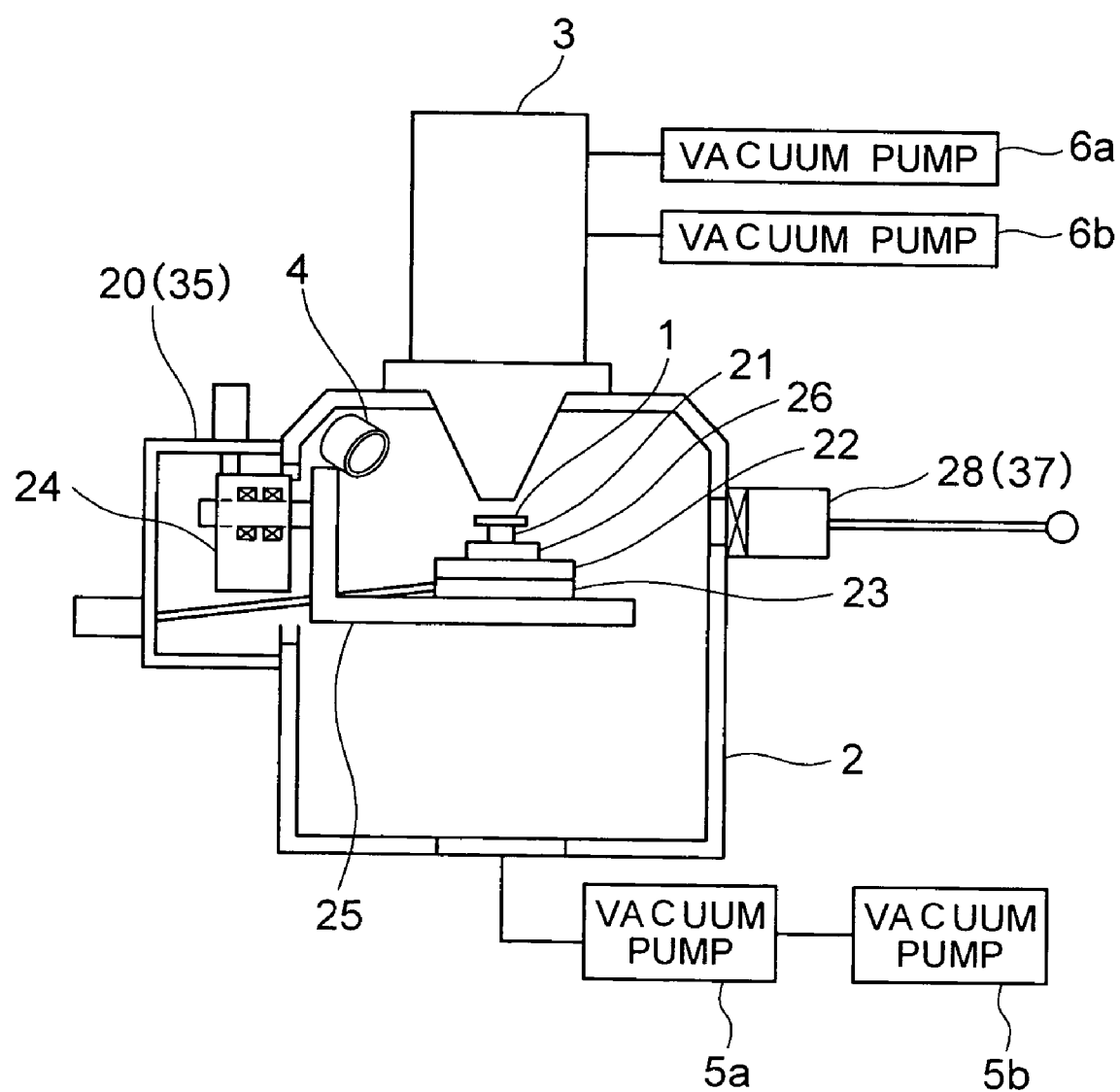
FIG. 2 is a longitudinal sectional view illustrating a conventional focused ion beam system which is equipped with a specimen moving stage.

Referring next to FIG. 2, description will be made on the configuration of the focused ion beam system which is mounted with a SEM specimen holder. This focused ion beam system comprises a specimen chamber 2; an FIB column 3 disposed above the specimen chamber 2; a specimen moving stage 20 and a SEM holder exchanger chamber 28 disposed along the x-axis direction; a secondary electron detector 4 for detecting secondary electrons; and vacuum pumps 5a, 5b and 6a, 6b for evacuating the specimen chamber 2 and FIB column 3, respectively.

The specimen moving stage 20 comprises a specimen holder 21 for holding a specimen 1 (hereinafter called the "SEM specimen holder"); an x-table 22 for moving the specimen 1 in the x-direction; a y-table 23 for moving the specimen 1 in the y-direction; a z-table 24 for moving the specimen 1 in the z-direction (optical axis direction); a tilt table 25 for obliquely rotating the specimen 1 about an axis parallel with the x-axis; and a rotation table 26 for rotating the specimen 1 about the z-axis.

The SEM specimen holder 21 is introduced into and extracted from the focused ion beam system through the SEM holder exchanger chamber 28. This enables the SEM specimen holder 21 to be introduced into or extracted from the focused ion beam system without opening the specimen chamber 2, which is held in vacuum, to the atmosphere.

The SEM specimen holder 21, which holds the specimen 1, is mounted on the specimen moving stage 20 through the SEM holder exchanger chamber 28. The specimen 1 is irradiated with an ion beam on its surface to make a hole to expose a site under observation. After the processing, the SEM specimen holder 21 is extracted from the focused ion beam system through the SEM holder exchanger chamber 28, and mounted in a SEM. Specifically, the SEM specimen holder 21 is mounted on the specimen moving stage 20 within the specimen chamber 2 through the specimen exchange mechanism of the SEM. The bottom of the hole can be observed without moving the specimen 1, whereas the side wall of the hole can be observed by tilting the tilt table 25.

Figure 3:
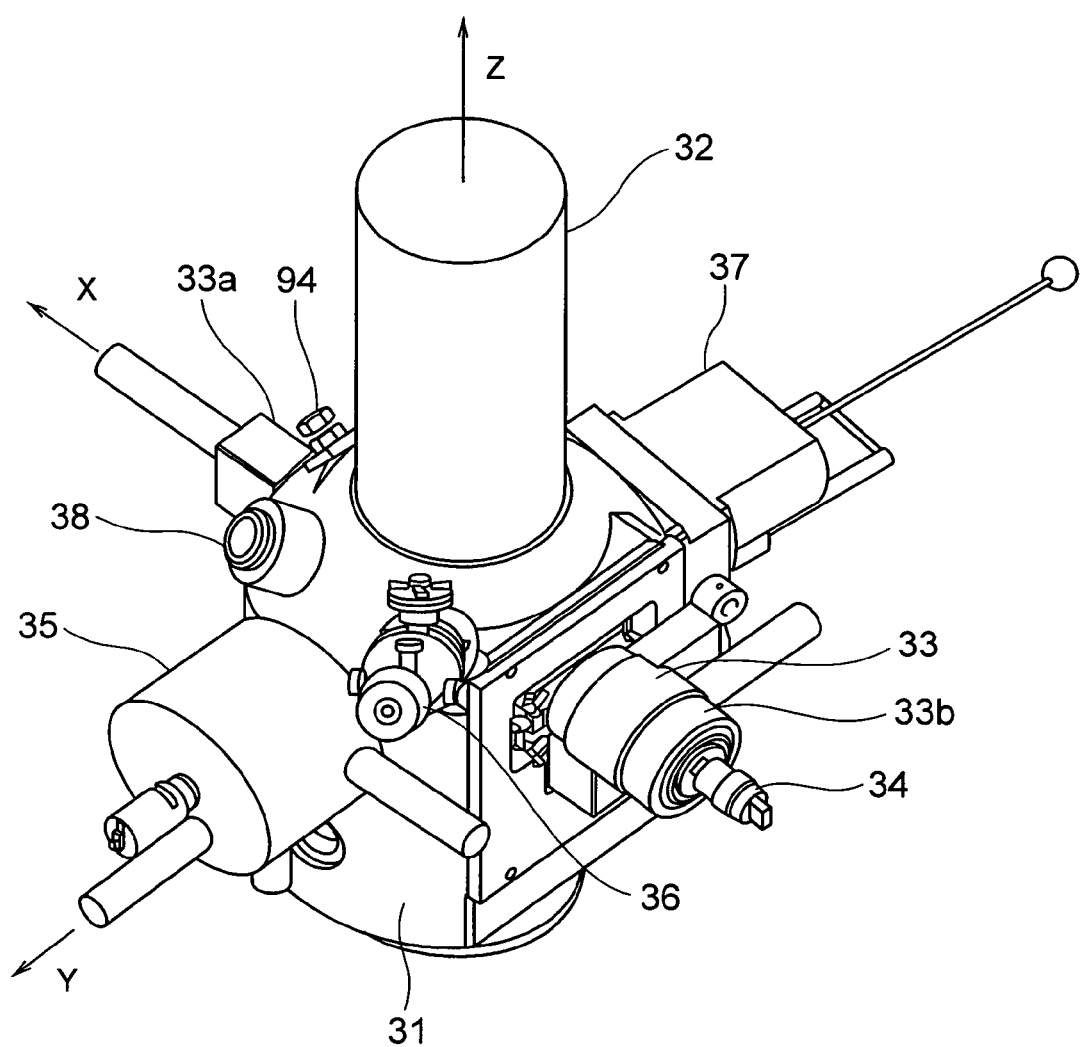
FIG. 3 is a perspective view illustrating the appearance of a focused ion beam system according to the present invention.

FIG. 3 illustrates the appearance of the focused ion beam system according to one embodiment of the present invention. The x-axis, y-axis, and z-axis are defined as illustrated for purposes of explanation. The focused ion beam system in this embodiment comprises a specimen chamber 31; an FIB column 32 disposed above the specimen chamber 31; a side entry stage 33 and a TEM specimen holder 34 disposed along the x-axis direction; a micro-sampling manipulator 35 and a SEM holder exchanger chamber 37 disposed along the y-axis direction; a deposition system 36; and a secondary electron detector 38. The side entry stage 33 includes an x-micromotion driver 33a, and a yzt-micromotion driver 33b.

The focused ion beam system of this embodiment generally has the side entry stage 10 of FIG. 1 incorporated in the focused ion beam system of FIG. 2. Therefore, the side entry stage 33 and TEM specimen holder 34 in this embodiment correspond to the side entry stage 10 and TEM specimen holder 11 in FIG. 1, respectively, while the SEM holder exchanger chamber 37 in this embodiment corresponds to the SEM holder exchanger chamber 28 in FIG. 2.

Figure 4:
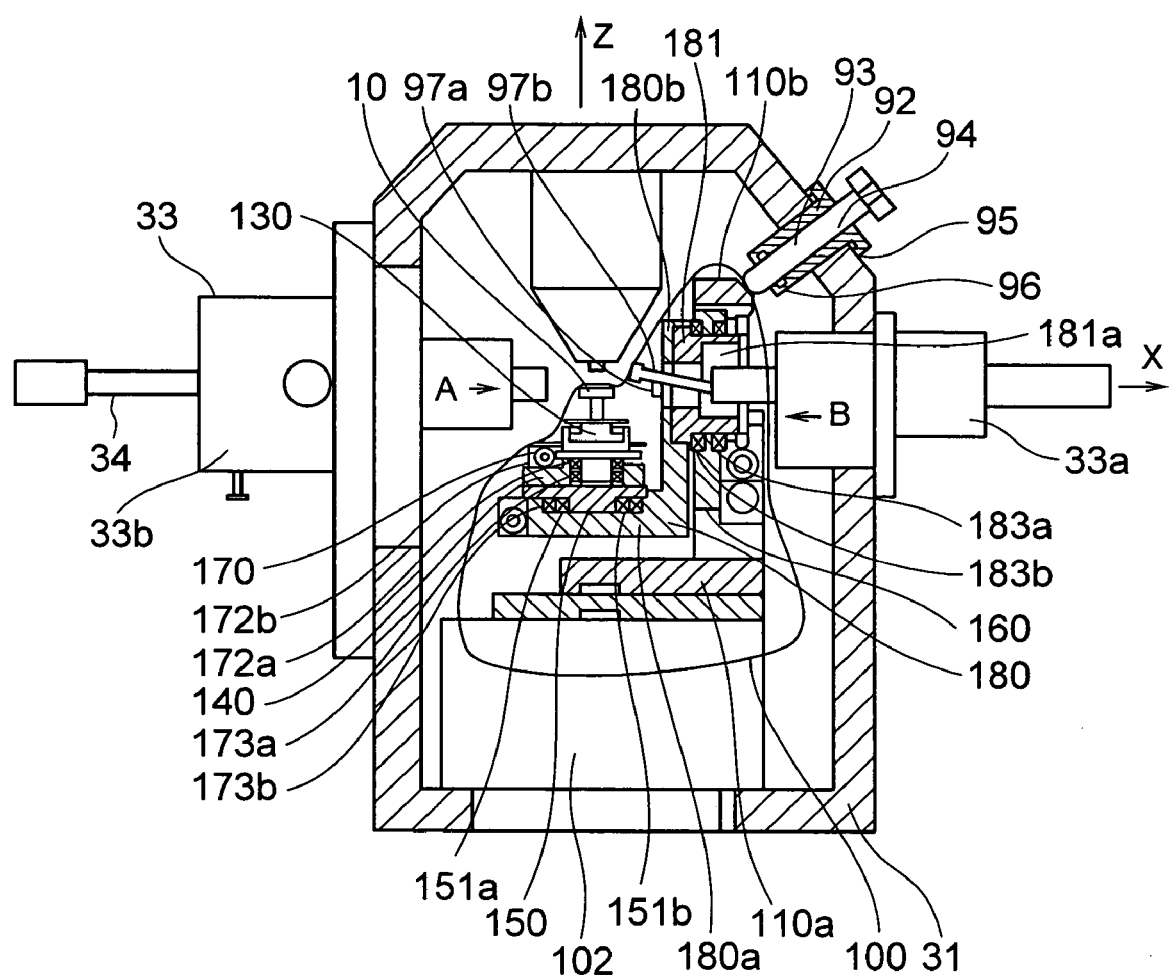
FIG. 4 is a cross-sectional view of the focused ion beam system according to the present invention, taken along an xz-plane, illustrating the relationship between the specimen moving stage and side entry stage during ion beam processing.

Referring now to FIG. 4, description will be made on the configuration of the focused ion beam system in this embodiment. FIG. 4 is a cross-sectional view taken in the xz-plane, illustrating the configuration of the focused ion beam system in this embodiment. A SEM stage 100 is disposed in the specimen chamber 31. As mentioned above, the SEM stage 100, which corresponds to the specimen moving stage 20 in FIG. 2, has a stage frame substantially in an L-shape, which is composed of a bottom plate 110a, and side plates 110b perpendicular to the bottom plate 110a. The bottom plate 110a of the stage frame is fixed on a base 102 attached to the bottom of the specimen chamber 31.

The SEM stage 100 comprises a specimen holder 130 for holding a specimen 10 (hereinafter called the "SEM specimen holder"); an x-table 140, a y-table 150, and a z-table 160 for moving the specimen 10 in the x-direction, y-direction, and z-direction, respectively; a rotation table 170 for rotating the specimen 10 about the z-axis; and a tilt table 180 for rotating the specimen 10 about an axis parallel with the x-axis.

As mentioned above, the x-axis, y-axis, and z-axis are set in the focused ion beam system. Therefore, when the tilt table 180 is tilted, by way of example, the y-table 150 and z-table 160 move along axes which are oblique to the y-axis and z-axis, respectively. However, for convenience of explanation, it is assumed that the x-table 140, y-table 150, and z-table 160 move in directions in which the tilt table 180 presents a tilt angle of zero degree.

The tilt table 180 has a rotating axis set to pass the intersection of the surface of the specimen 10 with the z-axis (optical axis). This setting provides an eucentric structure which permits the viewing field of the microscope to remain fixed even if the tilt table 180 is rotated to tilt the specimen 10.

Figure 7:
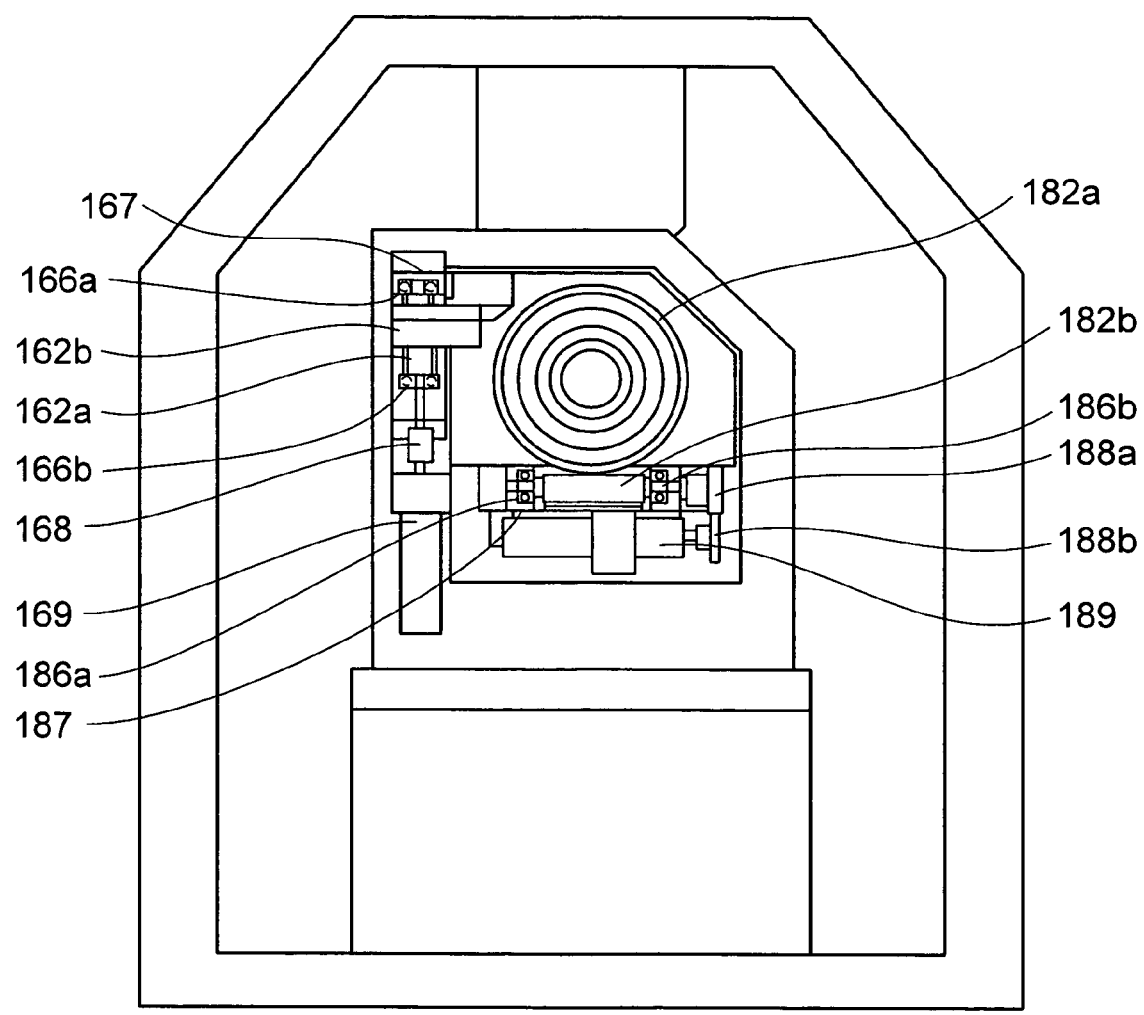
FIG. 7 is a cross-sectional view, taken from a direction indicated by an arrow B in FIG. 4, illustrating the structure of the focused ion beam system according to the present invention.

The z-table 160, which is made of a flat plate arranged perpendicular to the x-axis, is coupled to a side plate 110b of the stage frame 110 through cross-roller bearings 161a, 161b. As illustrated in FIG. 7, the z-table 160 can be transported by a feeding action of the z-screw 162a and a z-nut 162. The z-screw 162a has both ends supported by ball bearings 166a, 166b, and attached to the z-table 160 with a bearing housing 167. The z-screw 162 has one end coupled to a DC motor 169 through a coupling 168, where the DC motor 169 is attached to the bottom plate 110a of the stage frame 110. The z-table 160 is guided by the cross roller bearings 161a, 161b to move in the z-direction by driving the DC motor 169 to rotate the z-screw 162a, causing the sample 10 to move in the z-direction.

The tilt table 180, which has a cross-section substantially in an L-shape, is made up of a bottom plate 180a, and side plates 180b perpendicular to the bottom plate 180a. A tilt shaft 181 is attached to the side plate 180b in parallel with the x-axis, and is rotatably coupled to the z-table 160 through ball bearings 183a, 183b. As illustrated in FIG. 7, a worm wheel 182a is attached to the tilt shaft 181, and a worm gear 182b, which mates with the worm wheel 182a, is supported by ball bearings 186a, 186b, and attached to the z-table 160 with a bearing housing 187. A spur gear 188a is attached to one end of the worm gear 82b, and is meshed with a spur gear 188b attached to an output shaft of the DC motor 189. The DC motor 189 is attached to the z-table 160. The DC motor 189 is driven to rotate the worm wheel 182a and worm gear 182b, thereby causing rotations of the tilt shaft 181 to tilt the specimen 10. The tilt shaft 181 includes a hollow area 181a.

Figure 6:
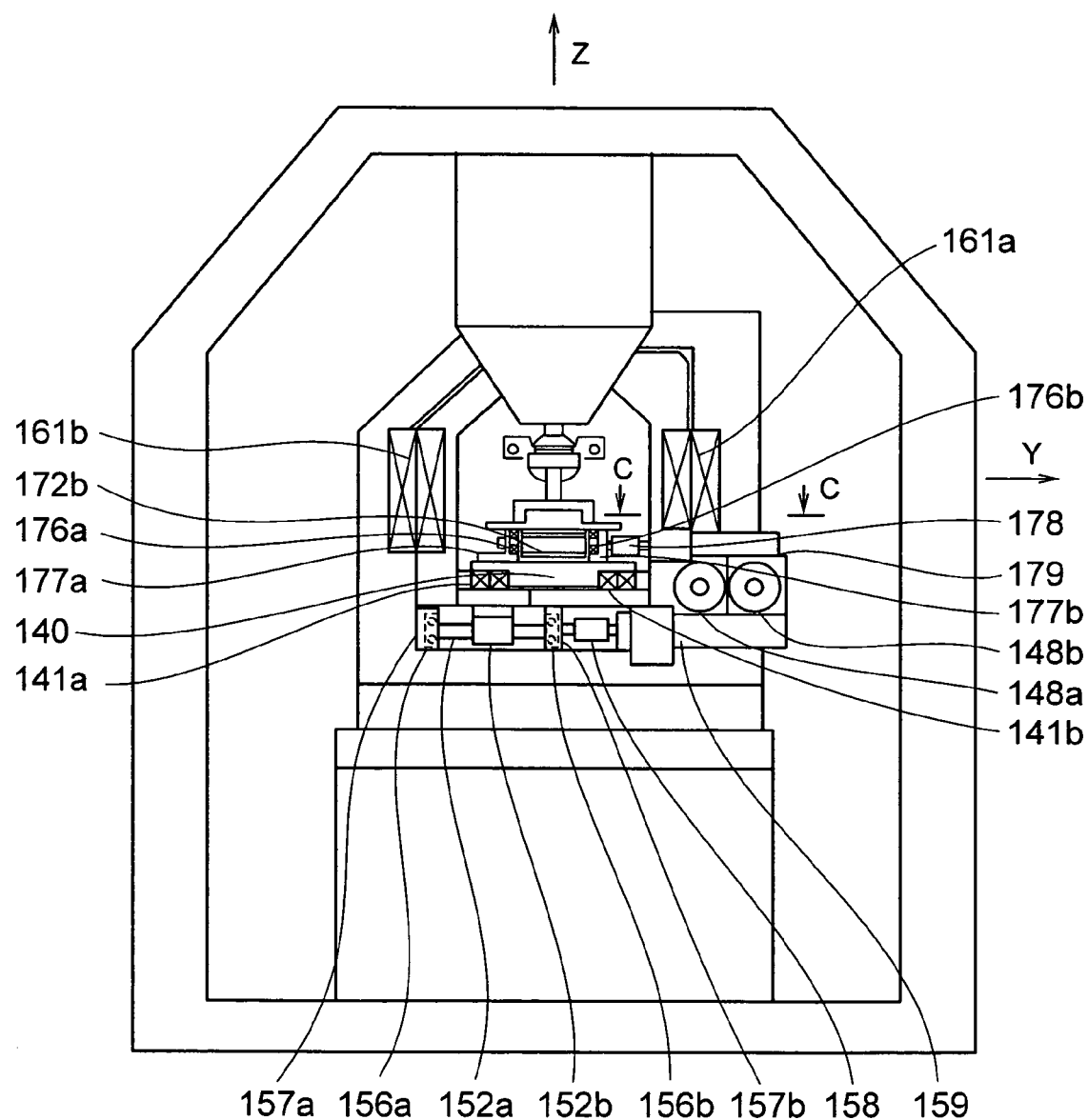
FIG. 6 is a cross-sectional view, taken from a direction indicated by an arrow A in FIG. 4, illustrating the structure of the focused ion beam system according to the present invention.

The y-table 150 is attached to the bottom plate 180a of the tilt table 180 through cross roller bearings 151a, 151b. As illustrated in FIG. 6, the y-table 150 is transported by a feeding action made by a y-ball screw 152a and a y-nut 152b. The y-nut 152b is fixed on the y-table 150. The y-ball screw 152a has both ends supported by ball bearings 156a, 156b, and is attached to the bottom 180a of the tilt table 180 with bearing housings 157a, 157b.

A DC motor 159 is coupled to one end of the y-ball screw 152a through a coupling 158, and is attached to the tilt table 180. The y-table 150 is guided by the cross roller bearings 151a, 151b to move the specimen 10 in a direction perpendicular to the x-axis by driving the DC motor 159 to rotate the y-ball screw 152a.

Figure 8:
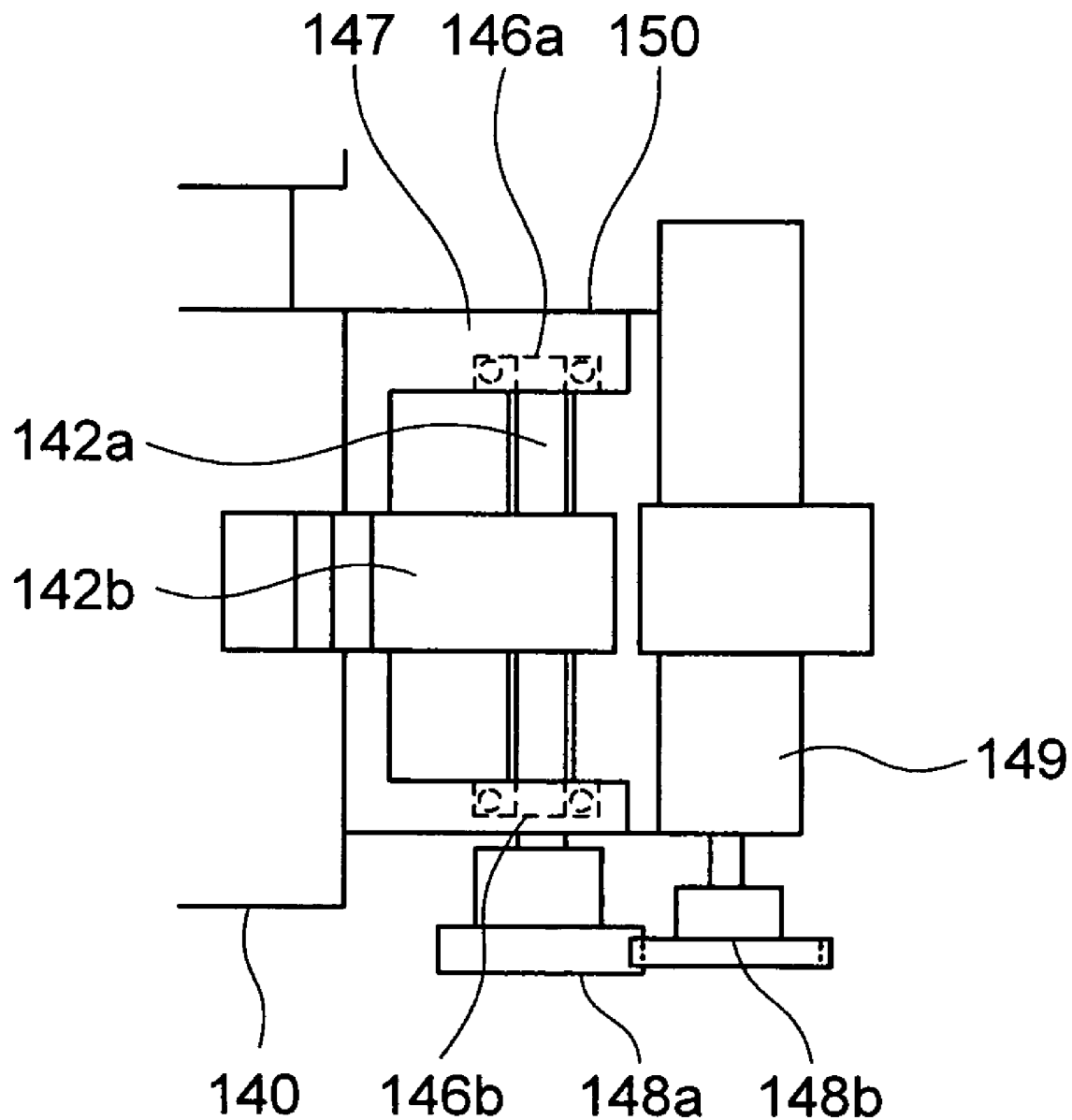
FIG. 8 is a cross-sectional view, taken from a direction indicated by arrows C in FIG. 6, illustrating the structure of the focused ion beam system according to the present invention.

As illustrated in FIG. 6, the x-table 140 is attached to the y-table 150 through the cross roller bearings 141a, 141b. As illustrated in FIG. 8, the x-table 140 is transported by a feeding action made by the x-ball screw 142a and x-nut 142b. The x-nut 142b is fixed to the x-table 140. The x-ball screw 142a has both ends supported by bearings 146a, 146b, and is attached to the y-table 150 with a bearing housing 147. A spur gear 148a is attached to one end of the ball screw 142a, while a spur gear 148b, which meshes with the spur gear 148a, is coupled to an output shaft of the DC motor 149 which is fixed on the y-table 150.

The x-table 140 is guided by cross roller bearings 141a, 141b to move in the x-direction to transport the specimen 10 in the x-direction by driving the DC motor 149 to rotate the x-ball screw 142a.

The rotation table 170 is rotatably coupled to the x-table 140 through ball bearings 173a, 173b. A worm wheel 172a is attached to the rotation table 170, while a worm gear 172b has both ends supported by ball bearings 176a, 176b, and is attached to the x-table 140 with bearing housings 177a, 177b, as illustrated in FIG. 6. A DC motor 179 is coupled to one end of the worm gear 172b through a coupling 178. The DC motor 179 is attached to the x-table 140. The rotation table 170 is rotated to rotate the specimen 10 by driving the DC motor 179 to rotate the worm gear 172b and worm wheel 172a.

A rotary encoder is mounted on the back of each of the DC motors 149, 159, 169, 189 for driving the x-table 140, y-table 150, z-table 160, and tilt table 180, respectively. For the rotation table 170, a rotary encoder is mounted to one end of the worm gear 172b. These rotary encoders detect the positions, tilt angles, rotating angles of the associated tables for positioning of the respective tables.

Figure 5:
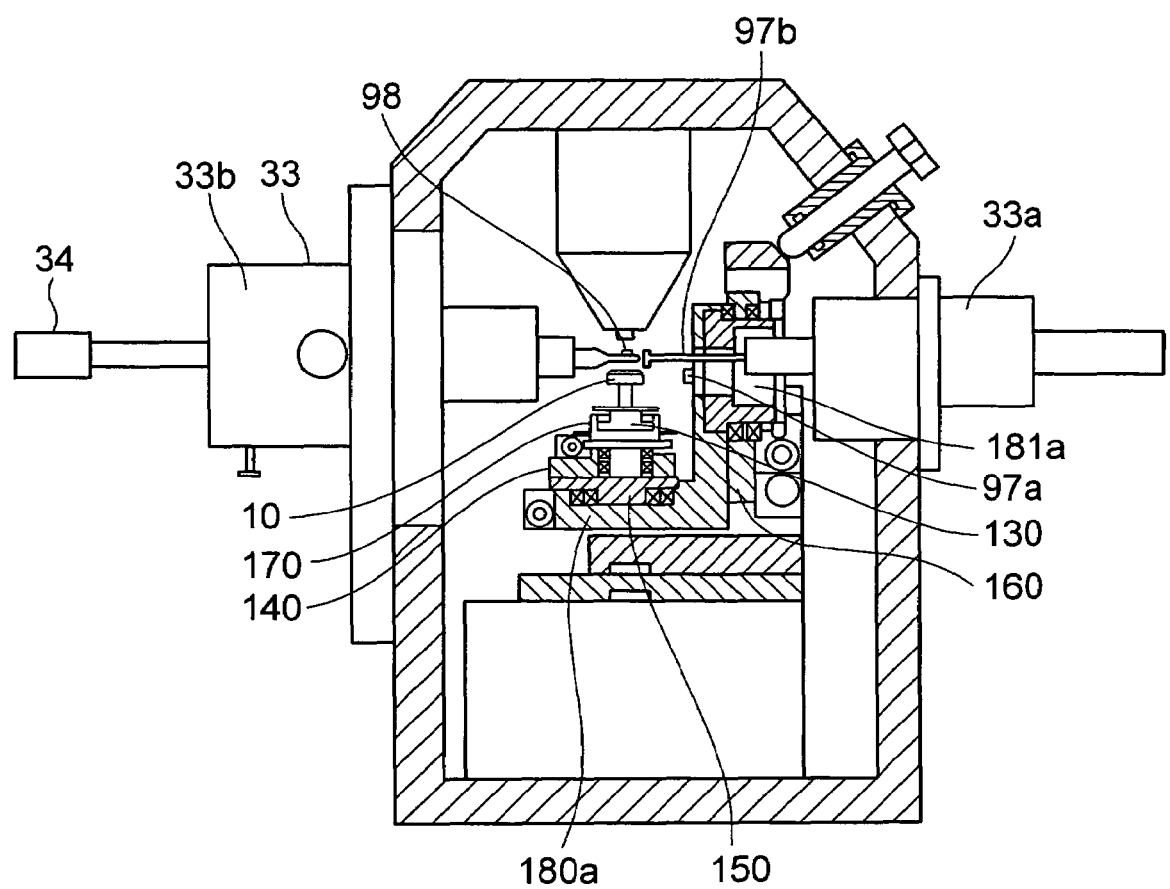
FIG. 5 is a cross-sectional view of the focused ion beam system according to the present invention, taken along an xz-plane, illustrating how a miniature specimen piece cut out from a specimen is transferred to a TEM specimen holder after the ion beam processing.

Referring to FIGS. 4 and 5, description is continued. The yzt-micromotion driver 33b of the side entry stage 33 is fitted in an opening formed through the front surface of the specimen chamber 31. The x-micromotion driver 33a is attached in the back of the specimen chamber 31 opposite to the yzt-micromotion driver 33b, and disposed in the hollow area 181a of the tilt shaft 181. The hollow area 181a of the tilt shaft 181 is sized such that movements of the x-table 140, y-table 150, z-table 160, tilt-table 180, and rotation table 170 will not cause these tables to come into contact with the x-micromotion driver 33a.

A lock receiver 92 is provided through the wall of the specimen chamber 31 in an upper region thereof, with a lock screw 94 being screwed into a female threaded opening 93 of the lock receiver 92. The leading end of the lock screw 94 presses the side plate 110b of the stage frame 110 of the specimen moving stage 100. O-rings 95, 96 provide a sealing structure between the locking screw 94 and specimen chamber 100. The foregoing structure improves the anti-vibration property of the specimen moving stage 100, improves the accuracy of fabricating specimen, improves the observation resolution, and facilitates a search for a specimen cut-out position.

The operation of the specimen moving stage 100 will be described below with reference to FIGS. 4 and 5. FIG. 4 shows the relationship between the specimen moving stage 100 and side entry stage 33 when the specimen 10 is processed with an ion beam. A flapper 97a is mounted on the side plate 180b of the tilt table 180. Assume that the tilt table 180 is not tilted for simplifying the description. The z-table 160 has moved upward, so that the leading end 97b of the x-micromotion driver 33a is lifted up by the flapper 97a which has also moved upward. The TEM specimen holder 34 stays at a position retracted from the yzt-micromotion driver 33b. The specimen 10 mounted on the TEM specimen holder 130 can be processed by a focused ion beam. An exemplary method of processing the specimen 10 with a focused ion beam will be described later with reference to FIG. 9.

FIG. 5 illustrates a miniature specimen piece cut out from the specimen which has been transported from the SEM specimen holder 130 to the TEM specimen holder 34 after the focused ion beam processing. The z-table 160 has moved downward, so that the flapper 97a, which has also moved downward, is spaced apart from the leading end 97b of the x-micromotion driver 33a. The miniature specimen piece 98 cut out from the specimen 10 has been carried on the leading end of the TEM specimen holder 34. The x-micromotion driver 33a and yzt-micromotion driver 33b have been returned to their respective regular positions, with their leading ends being in contact with each other.

Figure 9:
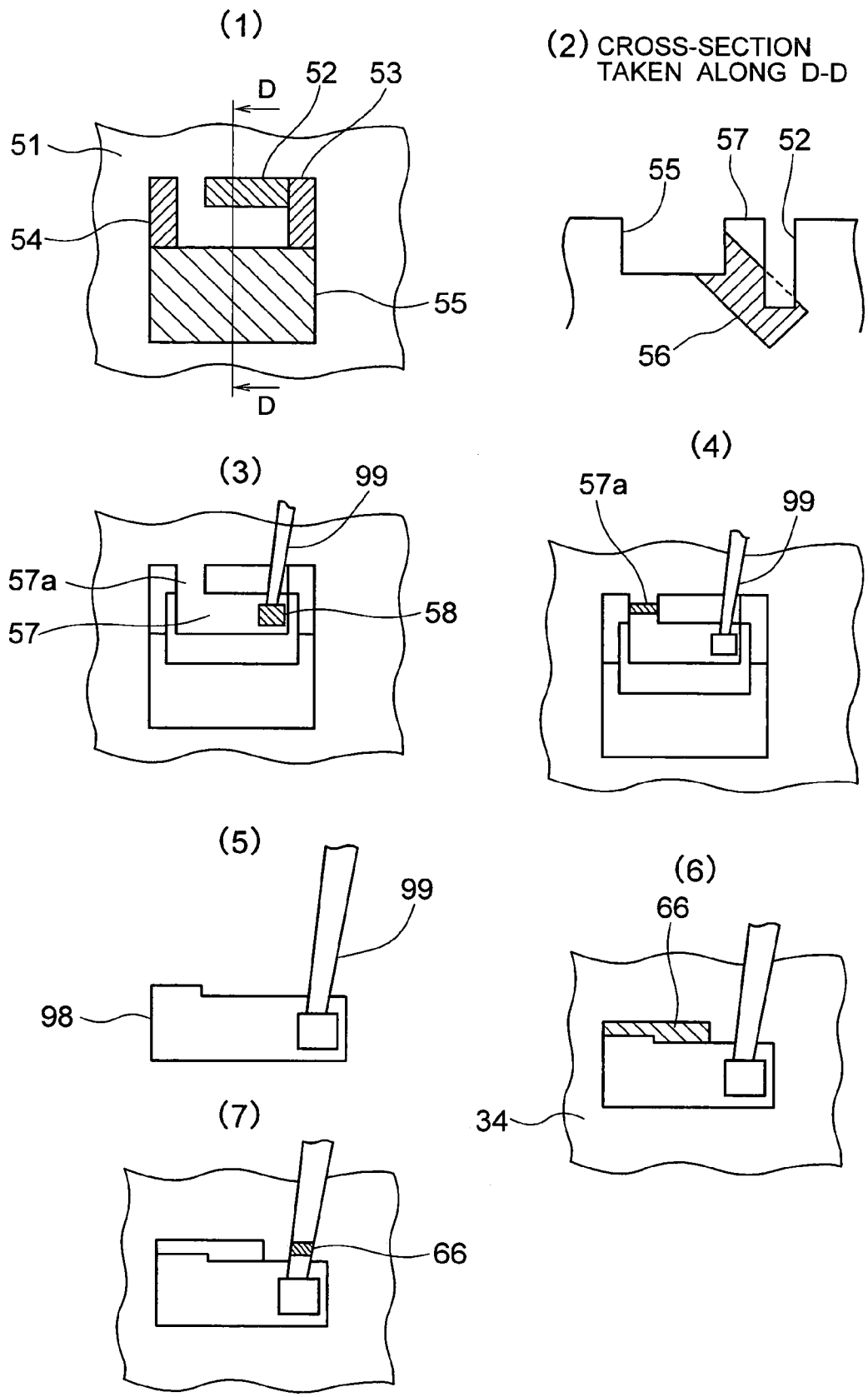
FIG. 9 shows how a miniature specimen piece is cut out from a specimen on the specimen moving stage, and transferred to and placed on the TEM specimen holder.

Referring now to FIG. 9, description will be made on a method of creating a miniature specimen piece for observation by a TEM using the focused ion beam system of the present invention. The method of creating a miniature specimen piece is known as a micro-sampling method. The focused ion beam system in this embodiment comprises the specimen moving stage 100 which has the TEM specimen holder 34 and SEM specimen holder 130, so that a miniature specimen piece can be cut out from a specimen held by the SEM specimen holder 130 and transported to the TEM specimen holder 34. In this way, the TEM specimen holder 34, which holds the specimen for observation by a TEM, is removed from the focused ion beam system and mounted in the TEM.

First, the SEM specimen holder 130 which carries the specimen 10 is inserted into the focused ion beam system through the SEM holder exchanger chamber 37, and mounted on the specimen moving stage 100. As illustrated in FIG. 4, the TEM specimen holder 34 stays at a retracted position. The x-table 140 and y-table 150 of the specimen moving stage 100 are moved to search for a site to be processed, and the rotation table 170 is driven to determine a direction in which the specimen 10 is cut out. This and subsequent works are done while observing a SIM image produced by detected secondary particles from the surface of the specimen 10 which is irradiated with a focused ion beam.

FIG. 9(1) illustrates the planar structure of a surface of a specimen to be processed, and FIG. 9(2) illustrates the structure in cross section. As illustrated, the surface 51 of the specimen to be processed is irradiated with a focused ion beam to form four grooves 52, 53, 54, 55. Next, as illustrated in FIG. 9(2), a groove 56 is formed as tilted with respect to the processed specimen surface 51. First, the specimen is tilted using the tilt table 180 of the specimen moving stage 100, and a shaded area 56 is irradiated with the focused ion beam for removal. Since the tilt table 180 is in eucentric structure, the processed target will not disappear from the SIM image screen even if the tilt table 180 is tilted. After the processing, the tilt table is returned from its tilting posture such that the processed surface 51 of the specimen 10 is in a horizontal orientation.

The formation of the groove 56 results in an elongated columnar area 57 formed above the groove 56. As illustrated in FIG. 9(3), the columnar area 57 is connected to the specimen through a junction 57a. Next, the micro-sampling manipulator 35 is used to bring the leading end of a probe 99 into contact with the columnar area 57. The deposition system 36 is used to deposit tungsten on a contact area 58 for adhesion. Next, as illustrated in FIG. 9(4), the junction 57a is irradiated with a focused ion beam for removal. Consequently, the columnar area 57 is separated from the specimen, resulting in the formation of a miniature specimen piece 98, as illustrated in FIG. 9(5).

The micro-sampling manipulator 35 is used to retract the probe 99 which holds the miniature specimen piece 98. The z-table 160 is moved down to retract the SEM specimen holder 130, which holds the specimen 10, in a downward direction. As illustrated in FIG. 5, the flapper 97a moves down to bring the leading end 97b of the x-micromotion driver 33a into a horizontal posture. Next, as illustrated in FIG. 5, the TEM specimen holder 34 is moved inward into contact with the leading end 97b of the x-micromotion driver 33a, and fixed thereto.

Next, the micro-sampling manipulator 35 is used to insert the probe 99, which holds the miniature specimen piece 98, into the specimen chamber 31. As illustrated in FIG. 9(6), the miniature specimen piece 98 held at the leading end of the probe 99 is placed on a mesh leading end of the TEM specimen holder 34. The deposition system 36 is used to deposit tungsten on a shaded area 66 to fix the miniature specimen piece 98 on the TEM specimen holder 34. Next, as illustrated in FIG. 9(7), a focused ion beam is irradiated to an area 61 near the leading end of the probe 99 to cut off the leading end of the probe 99.

Finally, the TEM specimen holder 34 is withdrawn from the yzt-micromotion driver 33b, and mounted on the side entry stage 33 of the TEM for observation thereby. When a SIM image is observed, the energy of the focused ion beam is reduced to prevent damages to the specimen.

While the foregoing description has been made on a method of fabricating a specimen for use with a TEM using the focused ion beam system of the present invention, the focused ion beam system of the present invention can also be used to fabricate a specimen for use with a SEM.

While the present invention has been described above in connection with certain embodiment by way of example, it should be understood by those skilled in the art that the present invention is not limited to the foregoing embodiments but can be modified in various manners without departing from the scope of the invention as defined by the appended claims.

The present invention has the advantage of facilitating and simplifying works involved in creating a specimen for use with a TEM and placing the specimen in a TEM specimen holder.

Specifically, the works can be readily and continuously carried out from the formation of a miniature specimen piece from an arbitrary area of a specimen piece having the size of several centimeters, extraction of the miniature specimen piece, transportation of the miniature specimen piece to the TEM specimen holder, and placement of the miniature specimen piece in the TEM specimen holder. Thus, the works can be efficiently accomplished in a shorter time.

Further, according to the present invention, a reduction in size of the specimen moving stage advantageously results in an improved anti-vibration property and an improved resolution of the focused ion beam system to allow the operator to efficiently progress the works while viewing a SIM image.

Also advantageously, the focused ion beam system of the present invention can accurately fabricate a miniature specimen piece of a semiconductor device for observation.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A focused ion beam system comprising:
   a specimen chamber;
   an FIB column disposed in the specimen chamber;
   a SEM stage disposed in the specimen chamber and having a SEM specimen holder,
   a side entry stage and a TEM specimen holder disposed along an x-axis direction of said specimen chamber; and
   a micro-sampling manipulator and a SEM holder exchanger chamber disposed along a y-axis direction of said specimen chamber, wherein;
   the SEM stage comprises:
      an x-table for moving a specimen in the x-direction;
      a y-table for moving the specimen in a direction perpendicular to the x-axis along a specimen plane;
      a z-table for moving the specimen in a direction perpendicular to the specimen plane and perpendicular to the x-axis;
      a rotation table for rotating the specimen about an axis perpendicular to the specimen plane; and
      a tilt table for rotating the specimen about an axis parallel with the x-axis;
   the side entry stage comprises;
      an x-micromotion driver for moving said TEM specimen holder in the x-direction; and a yzt-micromotion driver for moving said TEM specimen holder in the z-direction and in a tilted direction, wherein the x-micromotion driver and the yzt-micromotion driver are disposed in said specimen chamber to oppose each other, and said x-micromotion driver is disposed in a hollow area defined in a tilt shaft for rotatably supporting said tilt table;
   the tilt table including a protrusive flapper, said flapper configured to come into abutment to a leading end of said x-micromotion driver as said z-table moves up, causing the leading end of said x-micromotion driver to move up, said flapper further configured to move away from the leading end of said x-micromotion driver as said z-table moves down, causing the leading end of said x-micromotion driver to be positioned in abutment to the leading end of said yzt-micromotion driver.

2. A focused ion beam system comprising:
a specimen chamber;
an FIB column disposed in said specimen chamber;
a SEM stage for holding a specimen, said SEM stage being in an eucentric structure having a tilt shaft; and
a side entry stage loading with a TEM specimen holder in said specimen chamber;
wherein said side entry stage is disposed so that an axis of said TEM specimen holder is substantially in parallel to an axis of said tilt shaft of said SEM stage having said eucentric structure.

3. A focused ion beam system according to claim 2, wherein said side entry stage is disposed so that the axis of said TEM specimen holder substantially coincides with said axis of said tilt shaft of said SEM stage having said eucentric structure.

4. A focused ion beam system according to claim 2, wherein a hollow area is defined in a member forming said tilt shaft of said SEM stage having said eucentric structure and wherein an axis direction micromotion driver of said TEM specimen holder is disposed in said hollow area.

5. A focused ion beam system according to claim 2, further comprising:
a probe which takes a miniature specimen piece from the specimen held on said SEM stage having the eucentric structure or said side entry stage; and
a micro-sampling stage for driving said probe.

6. A focused ion beam system according to claim 2, wherein respective x-, y- and z-tables of said SEM stage having the eucentric structure are incorporated in said specimen chamber.

7. A focused ion beam system comprising:
a specimen chamber;
an FIB column disposed in said chamber;
a SEM stage having an eucentric structure including a tilt shaft;
a side entry stage loading with a TEM specimen holder;
a probe which takes a miniature specimen piece from a specimen held on said SEM stage having the eucentric structure or said side entry stage; and
a micro-sampling stage incorporated in said specimen chamber for driving said probe;
wherein said SEM stage having the eucentric structure includes a flapper for causing a leading end of an axis direction micromotion drive to move up, when a z-table of said SEM stage is moved up along an optical axis of said FIB column so that said flapper hits against said leading end, and for putting said leading end back into place, when said z-table moves down so that said flapper moves away from said leading end.

8. A focused ion beam system comprising:
a specimen chamber;
an FIB column disposed in said specimen chamber;
a SEM stage having an eucentric structure including a tilt shaft;
a side entry stage;
a probe which takes a miniature specimen piece from a specimen held on said SEM stage having the eucentric structure or said side entry stage;
a micro-sampling stage incorporated in said specimen chamber for driving said probe; and
a lock screw for processing a stage frame for supporting respective x-, y- and z-tables of said SEM stage having the eucentric structure at an upper portion of said specimen chamber.

9. A method for processing a specimen for an electron microscope, said method comprising steps of:
processing a specimen held on an SEM stage by a focused ion beam;
separating a miniature specimen piece from said specimen by means of a probe; and
fixing said miniature specimen piece on a TEM specimen holder mounted on a side entry stage.

10. A method according to claim 9, further comprising a step of determining a direction in which said specimen is cut out by driving said SEM stage so that a surface of the specimen to be observed by a TEM is substantially parallel to a tilt shaft of said SEM stage.

* * * * *